(12) United States Patent
Humphreys et al.

(10) Patent No.: US 7,098,754 B2
(45) Date of Patent: Aug. 29, 2006

(54) FRACTIONAL-N OFFSET PHASE LOCKED LOOP

(75) Inventors: Scott Robert Humphreys, Greensboro, NC (US); Ryan Lee Bunch, Greensboro, NC (US); Barry Travis Hunt, Jr., Greensboro, NC (US); Alexander Wayne Hietala, Phoenix, AZ (US)

(73) Assignee: RF Micro Devices, Inc., Greensboro, NC (US)

( * ) Notice: Subject to any disclaimer, the term of this patent is extended or adjusted under 35 U.S.C. 154(b) by 45 days.

(21) Appl. No.: 11/047,258

(22) Filed: Jan. 31, 2005

(65) Prior Publication Data

US 2006/0170505 A1 Aug. 3, 2006

(51) Int. Cl.
H03C 3/00 (2006.01)
H04L 27/20 (2006.01)
(52) U.S. Cl. .................... 332/103; 375/308
(58) Field of Classification Search ............ 332/103, 332/104, 105; 375/302, 308
See application file for complete search history.

(56) References Cited

U.S. PATENT DOCUMENTS

| | | | |
|---|---|---|---|
| 4,965,531 A | 10/1990 | Riley | 331/1 A |
| 6,396,355 B1 * | 5/2002 | Rezin | 331/18 |
| 6,526,265 B1 | 2/2003 | Damgaard et al. | 455/118 |
| 6,671,500 B1 | 12/2003 | Damgaard et al. | 455/118 |
| 6,693,468 B1 | 2/2004 | Humphreys et al. | 327/105 |
| 6,710,664 B1 | 3/2004 | Humphreys et al. | 331/11 |
| 6,724,265 B1 | 4/2004 | Humphreys | 331/17 |
| 6,731,145 B1 | 5/2004 | Humphreys et al. | 327/156 |
| 6,806,786 B1 | 10/2004 | Lam et al. | 331/179 |
| 6,834,084 B1 | 12/2004 | Hietala | 375/296 |
| 6,838,951 B1 | 1/2005 | Nieri et al. | 331/177 V |

OTHER PUBLICATIONS

Strange et al. "A Direct Conversion Transceiver for Multi-Band GSM Application," IEEE Radio Frequency Integrated Circuits Symposium, 2000.
Zhinian Shu, Ka Lok Lee, and Bosco H. Leung, "A 2.4-GHz Ring-Oscillator-Based CMOS Frequency Synthesizer With a Fractional Divider Dual-PLL Architecture," IEEE Journal of Solid-State Circuits, vol. 39, No. 2, Mar. 2004, pp. 452-461.

* cited by examiner

Primary Examiner—David Mis
(74) Attorney, Agent, or Firm—Withrow & Terranova, PLLC

(57) ABSTRACT

A fractional-N offset phase locked loop (FN-OPLL) is provided. The FN-OPLL includes a fractional divider, a phase detector, a loop filter, a voltage controlled oscillator (VCO), and feedback circuitry. Combiner circuitry combines an initial fractional divide value and a modulation signal to provide a combined fractional divide value. Based on the combined fractional divide value, the fractional-N divider divides a reference frequency and provides a divided reference frequency to the phase detector. The phase detector compares a phase of the divided reference frequency to a phase of a feedback signal to provide a comparison signal. The comparison signal is filtered by the loop filter to provide a control signal to the VCO, where the control signal controls a frequency of an output signal of the VCO. The output signal is processed by the feedback circuitry to provide the feedback signal to the phase detector.

27 Claims, 3 Drawing Sheets

FRACTIONAL-N OFFSET PHASE LOCKED LOOP

FIELD OF THE INVENTION

The present invention relates to a phase locked loop (PLL) and more particularly relates to a fractional-N offset phase lock loop (FN-OPLL).

BACKGROUND OF THE INVENTION

Due to load pulling, power supply pushing, and radio frequency (RF) re-modulation effects in a narrow bandwidth phase locked loop (PLL), such as a fractional-N PLL, it is desirable to use a wide bandwidth PLL in some applications. In addition, when using the PLL for direct digital modulation as described in commonly owned and assigned U.S. Pat. No. 6,834,084, entitled DIRECT DIGITAL POLAR MODULATOR, issued Dec. 21, 2004, which is incorporated herein by reference in its entirety, narrow band PLLs may require pre-distortion and calibration. A typical wide bandwidth PLL is an Offset PLL (OPLL). However, OPLLs require an I/Q modulator in order to generate either a reference frequency provided to a phase detector of the OPLL or a feedback signal provided to the phase detector. The I/Q modulator requires careful design and an analog interface. However, in many applications, it is desirable to have a digital interface. Accordingly, there remains a need for a less complex wide bandwidth PLL having a digital interface.

In addition, in any PLL system, spurs may occur at a frequency $F_{SPUR}=m*F1+n*F2$, where F1 and F2 are fundamental signal frequencies, such as a reference frequency of the PLL, the frequency of a voltage controlled oscillator (VCO) within the PLL, or other external interfering sources. Thus, there further remains a need for a PLL and corresponding method capable of avoiding known spurs.

SUMMARY OF THE INVENTION

The present invention provides a fractional-N offset phase locked loop (FN-OPLL). In general, the FN-OPLL includes a first phase locked loop (PLL) having a fractional-N divider, a phase detector, a loop filter, a voltage controlled oscillator (VCO), and feedback circuitry. In operation, combiner circuitry combines an initial fractional divide value and a modulation signal to provide a combined fractional divide value. Based on the combined fractional divide value, the fractional-N divider divides a reference frequency and provides a divided reference frequency to the phase detector. The phase detector compares a phase of the divided reference frequency to a phase of a feedback signal to provide a comparison signal. The comparison signal is filtered by the loop filter to provide a control signal, which is provided to the VCO and controls a frequency of an output signal provided by the VCO. The output signal is processed by the feedback circuitry to provide the feedback signal to the phase detector.

In one embodiment, the feedback circuitry includes a mixer operating to multiply, or down convert, the output signal by a local oscillator signal. The local oscillator signal is provided by a second PLL, which may be a fractional-N PLL. The second PLL operates based on a second reference frequency and one or more fractional divider control signals defining a fractional divide value for the second PLL. The local oscillator signal may also be provided to the fractional-N divider as the reference signal for the first PLL such that the local oscillator signal may be systematically controlled to avoid known spurs.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
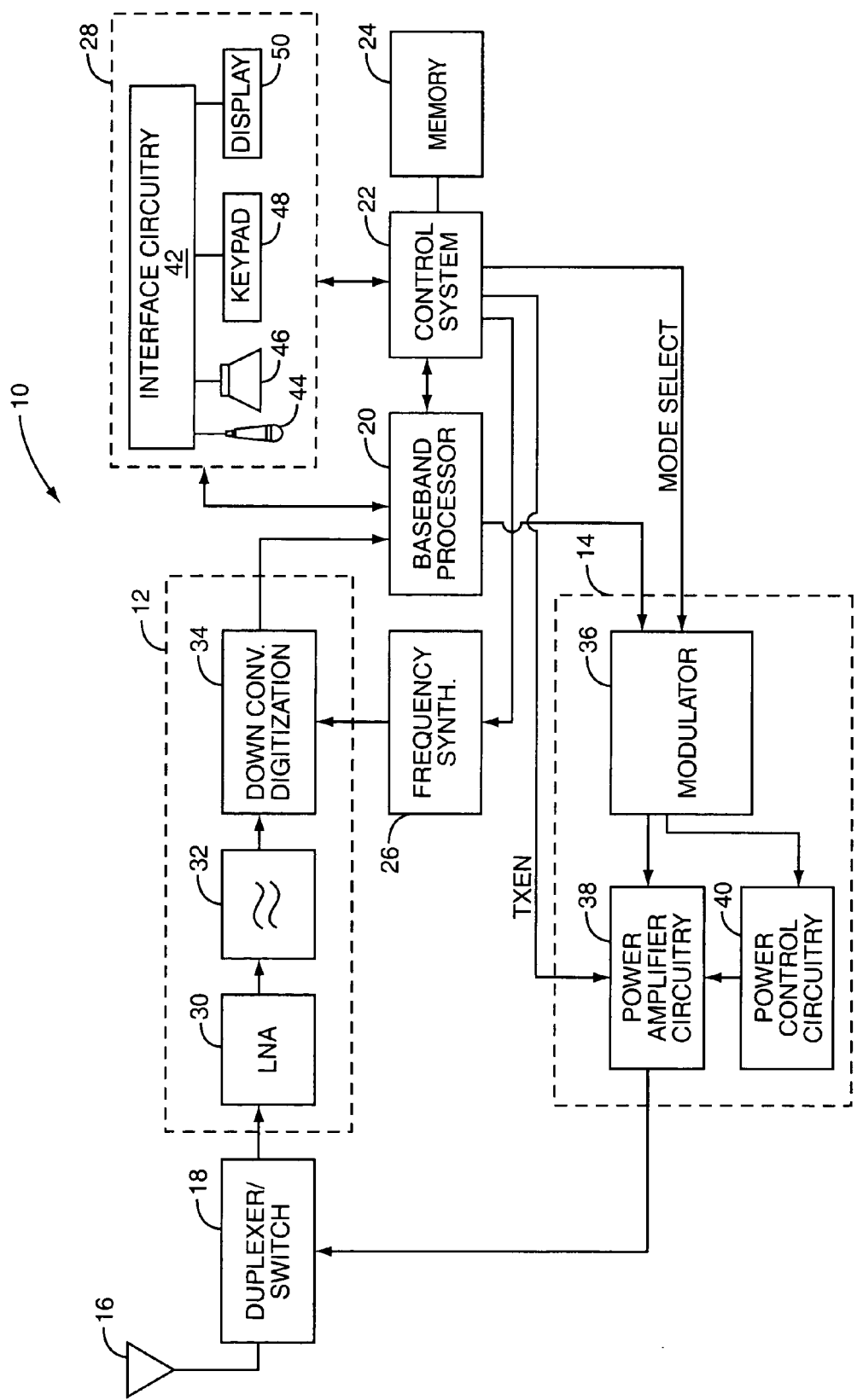
FIG. 1 illustrates a mobile terminal according to one embodiment of the present invention.

The present invention is preferably incorporated in a mobile terminal 10, such as a mobile telephone, personal digital assistant, wireless Local Area Network (LAN) device, a base station in a mobile network, or the like. The basic architecture of a mobile terminal 10 is represented in FIG. 1, and may include a receiver front end 12, a radio frequency transmitter section 14, an antenna 16, a duplexer or switch 18, a baseband processor 20, a control system 22, memory 24, a frequency synthesizer 26, and an interface 28. The receiver front end 12 receives information bearing radio frequency signals from one or more remote transmitters provided by a base station (not shown). A low noise amplifier 30 amplifies the signal. A filter circuit 32 minimizes broadband interference in the received signal, while a downconverter 34 downconverts the filtered, received signal to an intermediate or baseband frequency signal, which is then digitized into one or more digital streams. The receiver front end 12 typically uses one or more mixing frequencies generated by the frequency synthesizer 26.

The baseband processor 20 processes the digitized, received signal to extract the information or data bits conveyed in the received signal. This processing typically comprises demodulation, decoding, and error correction operations. As such, the baseband processor 20 is generally implemented in one or more digital signal processors (DSPs).

On the transmit side, the baseband processor 20 receives digitized data from the control system 22, which it encodes for transmission. The control system 22 may run software stored in the memory 24. Alternatively, the operation of the control system 22 may be a function of sequential logic structures as is well understood. After encoding the data from the control system 22, the baseband processor 20 outputs the encoded data to the radio frequency transmitter section 14. A modulator 36 receives the data from the baseband processor 20 and operates according to one or more modulation schemes to provide a modulated signal to the power amplifier circuitry 38. The modulation scheme of the modulator 36 is controlled by a mode select signal (MODE SELECT) from the control system 22. In one embodiment, the modulator 36 operates according to either an 8-Level Phase Shift Keying (8PSK) modulation scheme, which is a modulation scheme containing both amplitude and phase components, or a Gaussian Minimum Shift Keying (GMSK) modulation scheme, which is a constant amplitude modulation scheme. When in 8PSK mode, the modulator 36 provides a phase component ($\phi$) at a desired transmit frequency to the power amplifier circuitry 38 and an amplitude component (r) to the power control circuitry 40. The power control circuitry 40 controls an output power of the power amplifier circuitry 38 based on the amplitude component (r) or, optionally, a combination of a ramping signal and the amplitude component (r), thereby providing amplitude modulation of the phase component ($\phi$). When in GMSK mode, the modulator provides a phase modulated signal to the power amplifier circuitry 38 and the ramping signal to the power control circuitry 40, where the power control circuitry 40 controls the output power of the power amplifier circuitry 38 based on the ramping signal.

The power amplifier circuitry 38 amplifies the modulated signal from the modulator 36 to a level appropriate for transmission from the antenna 16. A gain of the power amplifier circuitry 38 is controlled by the power control circuitry 40. In essence, the power control circuitry 40 operates to control a supply voltage provided to the power amplifier circuitry 38 based on the amplitude component (r) or, optionally, a combination of the amplitude component (r) and the ramping signal from the modulator 36 when in the 8PSK mode and based on the ramping signal when in GMSK mode.

A user may interact with the mobile terminal 10 via the interface 28, which may include interface circuitry 42 associated with a microphone 44, a speaker 46, a keypad 48, and a display 50. The interface circuitry 42 typically includes analog-to-digital converters, digital-to-analog converters, amplifiers, and the like. Additionally, it may include a voice encoder/decoder, in which case it may communicate directly with the baseband processor 20.

The microphone 44 will typically convert audio input, such as the user's voice, into an electrical signal, which is then digitized and passed directly or indirectly to the baseband processor 20. Audio information encoded in the received signal is recovered by the baseband processor 20, and converted into an analog signal suitable for driving speaker 46 by the interface circuitry 42. The keypad 48 and display 50 enable the user to interact with the mobile terminal 10, input numbers to be dialed and address book information, or the like, as well as monitor call progress information.

Figure 2:
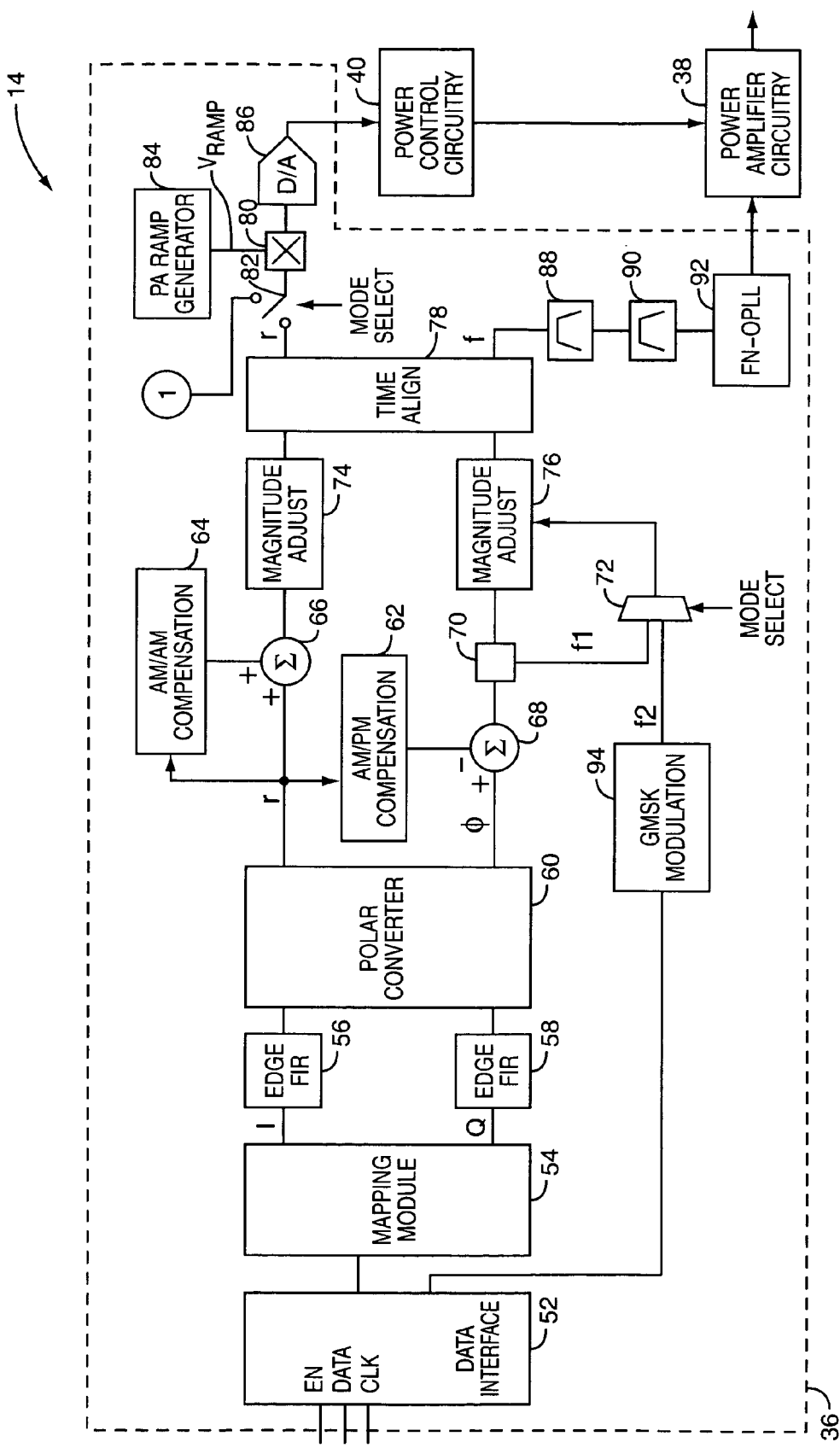
FIG. 2 is a more detailed illustration of the modulator of the mobile terminal of FIG. 1 including a fractional-N offset phase locked loop (FN-OPLL) according to one embodiment of the present invention.

FIG. 2 illustrates an exemplary embodiment of the modulator 36 wherein the modulator 36 operates in either an 8PSK (8-Level Phase Shift Keying) mode or GMSK (Gaussian Minimum Shift Keying) mode. It should be noted 8PSK and GMSK are exemplary modulation schemes and are not intended to limit the scope of the present invention. The modulator 36 includes several components, including a data interface 52, a mapping module 54, first and second filters 56, 58, and a polar converter 60. Other components of the modulator 36 will be discussed below. It should be noted that the data interface 52 may include First In First Out (FIFO) circuitry or may alternatively be a real time serial data interface.

The mapping module 54, the filters 56, 58, and the polar converter 60 form an 8PSK modulator. As discussed below, in this embodiment, the 8PSK modulator also includes amplitude modulation to phase modulation (AM/PM) compensation circuitry 62, amplitude modulation to amplitude modulation (AM/AM) compensation circuitry 64, and various other components as described below.

When in 8PSK mode, the data interface 52 receives data from the baseband processor 20 (FIG. 1) at the bit rate of the system. This data is passed to the mapping module 54, where the data is grouped into symbols of three consecutive data bits, Grey coded, and rotated by $3\pi/8$ on each symbol as per European Telecommunications Standards Institute (ETSI) specifications. The resulting symbol is mapped to one of sixteen points in an in-phase (I), quadrature phase (Q) constellation.

Both the in-phase (I) and the quadrature phase (Q) components for each point are then filtered by the first and second filters 56, 58, respectively. In an exemplary embodiment, the first and second filters 56, 58 are EDGE finite impulse response (FIR) filters. This, as dictated by the ETSI specifications, shapes the response between symbol times.

After filtering, both the in-phase (I) and the quadrature phase (Q) components are sent to the polar converter 60. The polar converter 60 uses a classical coordinate rotation digital computer (CORDIC) algorithm or like rectangular to polar conversion technique. Thus, the polar converter 60 generates phase ($\phi$) and amplitude (r) equivalent signals. Further information about CORDIC algorithms may be found in *Proceedings of the* 1998 *ACM/SIGDA Sixth International Symposium On Field Programmable Gate Arrays* by Ray Andraka, Feb. 22–24, pp. 191–200 and "The CORDIC Trigonometric Computing Technique" by Jack E. Volder *IRE Trans on Elect. Computers, p.* 330, 1959, both of which are hereby incorporated by reference in their entireties.

The amplitude signal (r) is split and directed to the AM/PM compensation circuitry 62, the AM/AM compensation circuitry 64, and summation circuitry 66. The AM/PM compensation circuitry 62 introduces a compensation term to the phase signal via subtraction circuitry 68 that, after further processing, counteracts the distortion introduced by AM to PM conversion in the power amplifier circuitry 38. The AM/AM compensation circuitry 64 introduces a compensation term to the amplitude signal via the summation circuitry 66 that, after further processing, counteracts the distortion introduced by AM to AM conversion in the power amplifier circuitry 38. Further details of the AM/PM compensation circuitry 62 and the AM/AM compensation circuitry 64 can be found in commonly owned and assigned U.S. patent application Ser. No. 10/147,569, entitled AM TO PM CORRECTION SYSTEM FOR POLAR MODULATOR, filed May 16, 2002; and U.S. patent application Ser. No. 10/147,579, entitled AM TO AM CORRECTION SYSTEM FOR POLAR MODULATOR, filed May 16, 2002, both of which are hereby incorporated by reference in their entireties.

The output of the subtraction circuitry 68, which is referred to herein as a combined signal, is directed to a phase to frequency converter 70. The output of the phase to frequency converter 70 is a frequency signal (f1), which generally corresponds to the desired frequency deviation of the modulated signal. The frequency signal (f1) is provided to a multiplexer switch 72, which is controlled by the mode select signal (MODE SELECT). When in the 8PSK mode, the mode select signal is provided such that the multiplexer switch 72 outputs the frequency signal (f1) from the phase to frequency converter 70. Magnitude adjusters 74, 76 then adjust the magnitude of the amplitude signal (r) and the frequency signal (f1), respectively, to a level expected by a time aligner 78, such that they comply with the appropriate standard. Next, a relative time delay is applied as necessary to the signals for best Error Vector Magnitude (EVM) and spectrum by the time aligner 78, such that the time aligner 78 provides the amplitude signal (r) and a frequency signal (f). The frequency signal (f) is a magnitude adjusted, time aligned version of the output of the multiplexer switch 72. Because these are preferably digital components, concerns about variations in analog components and the corresponding variation in time delays downstream are minimized.

At this point, the amplitude signal (r) and the frequency signal (f) separate and proceed by different paths, an amplitude signal processing path and a frequency signal processing path, to the power amplifier circuitry 38. With respect to the amplitude signal processing path, when in the 8PSK mode, the amplitude signal (r) is provided to a multiplier 80 via a switch 82, which is controlled by the mode select signal (MODE SELECT). A power amplifier (PA) ramp generator 84 generates a ramping signal ($V_{RAMP}$) and provides the ramping signal ($V_{RAMP}$) to the multiplier 80. The multiplier 80 operates to multiply the amplitude signal (r) and the ramping signal ($V_{RAMP}$) to provide a digital power control signal, which is converted to an analog power control signal by a digital-to-analog (D/A) converter 86. The analog power control signal is used by the power control circuitry 40 to set the collector voltage on the power amplifier circuitry 38. As the amplitude signal (r) changes, the voltage at the power amplifier circuitry 38 collector changes, and the output power will vary as $V^2/R_{out}$ ($R_{out}$ is not shown, but is effectively the load on the power amplifier circuitry 38). This is sometimes known as "plate modulation".

The frequency signal (f) from the time aligner 78 is directed to a digital filter 88 and a digital predistortion filter 90. Thereafter, the frequency signal (f), which is a digital signal, is provided to a fractional-N offset phase locked loop (FN-OPLL) 92 of the present invention to provide direct digital modulation similarly to that described in commonly owned and assigned U.S. Pat. No. 6,834,084, entitled DIRECT DIGITAL POLAR MODULATOR, issued Dec. 21, 2004, which has been incorporated herein by reference in its entirety. In one embodiment, the data interface 52 provides a digital data interface to the baseband processor 20, and the entire phase path from the data interface 52 to the FN-OPLL 92 is a digital path.

The FN-OPLL 92 generates an output at the desired radio frequency. In an exemplary embodiment, a fractional divide value is provided to a fractional-N divider in the FN-OPLL 92 based on the frequency signal (f). The FN-OPLL 92 is described in detail below. It should also be noted that in one embodiment, the FN-OPLL 92 has a wide bandwidth, such as 800 kHz, thereby reducing or eliminating the need for the digital predistortion filter 90. As such, the digital predistortion filter 90 is optional if not unnecessary.

The modulator 36 also includes a GMSK modulator, which includes the GMSK modulation circuitry 94. When in GMSK mode, the GMSK modulation circuitry 94 processes the data to generate a frequency signal (f2). In one embodiment, the GMSK modulation circuitry 94 is a look-up table. Another exemplary embodiment of the GMSK modulation circuitry 94 is discussed in U.S. Pat. No. 5,825,257, which is hereby incorporated by reference in its entirety. It should be appreciated that other embodiments of the GMSK modulation circuitry 94 may also be used and the particular circuitry is not central to the present invention.

The output of the GMSK modulation circuitry 94, which is the frequency signal (f2), is provided to the multiplexer switch 72. In GMSK mode, the multiplexer switch 72 outputs the frequency signal (f2) from the GMSK modulation circuitry 94. As discussed above, magnitude adjusters 74, 76 then adjust the magnitude of the amplitude signal (r) and the frequency signal (f2), respectively, to a level expected by the time aligner 78, such that they comply with the appropriate standard. Next, a relative time delay is applied as necessary to the signals for best Error Vector Magnitude (EVM) and spectrum by the time aligner 78.

At this point, the amplitude signal (r) and the frequency signal (f) output by the time aligner 78 separate and proceed by different paths to the power amplifier circuitry 38. With respect to the amplitude signal processing path, when in the GMSK mode, the switch 82 is controlled such that a unity signal is provided to the multiplier 80. Accordingly, the multiplier 80 multiplies the ramping signal ($V_{RAMP}$) from the PA ramp generator 84 by 1 to provide the digital power control signal, which is converted to the analog power control signal by the digital-to-analog converter 86. The analog power control signal is used by the power control circuitry 40 to set the collector voltage on the power amplifier circuitry 38.

As in 8PSK mode, when in GMSK mode, the frequency signal (f) from the time aligner 78 is directed to the digital filter 88, the optional digital predistortion filter 90, and the FN-OPLL 92. The FN-OPLL 92 generates the output at the desired radio frequency. In an exemplary embodiment, the frequency signal is applied to a single port on a fractional-N divider within the FN-OPLL 92.

Figure 3:
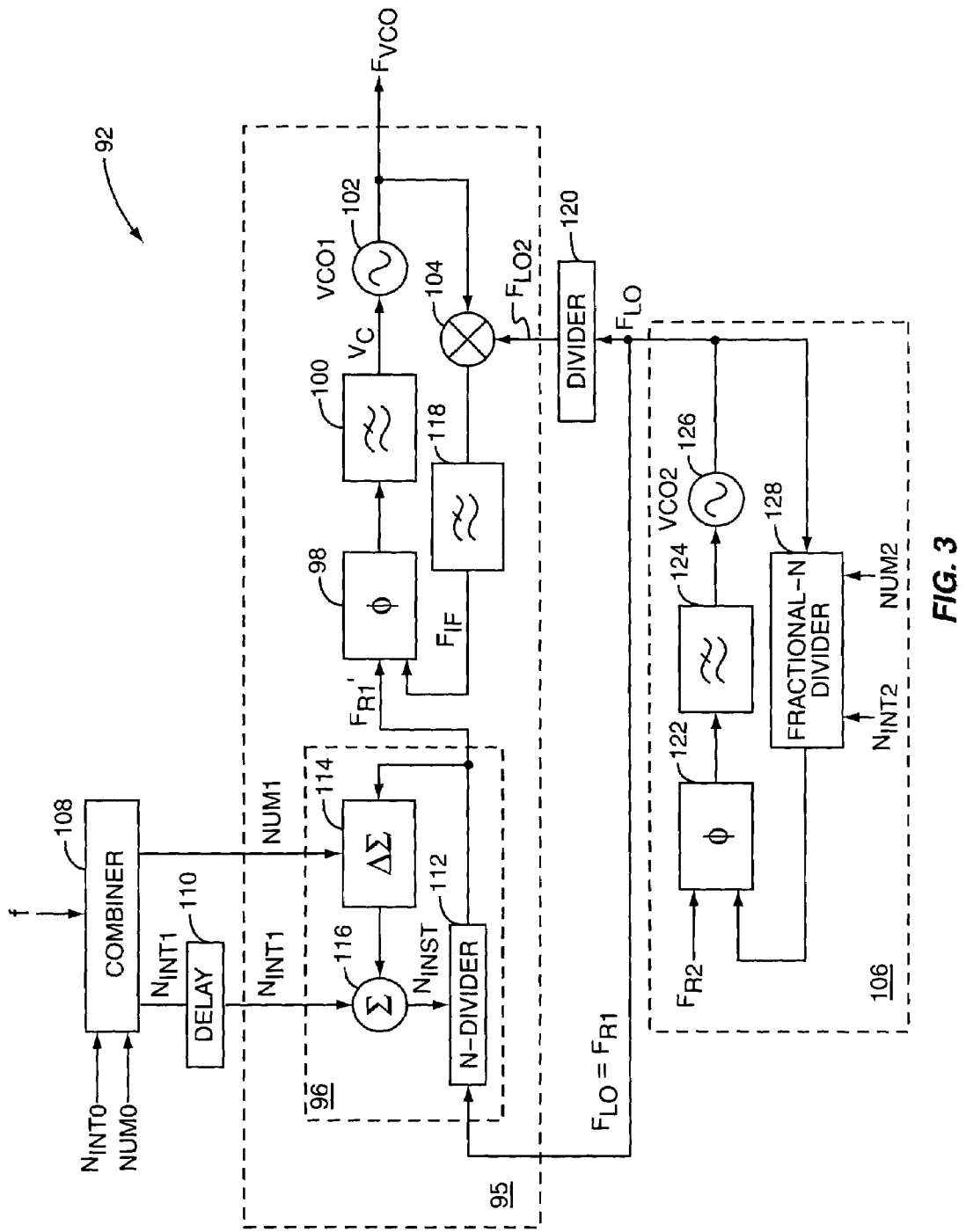
FIG. 3 illustrates an exemplary embodiment of the FN-OPLL of the present invention.

FIG. 3 illustrates one embodiment of the FN-OPLL 92 of the present invention. In general, the FN-OPLL 92 includes a first phase lock loop (PLL) 95, which includes a fractional-N divider 96, a phase detector 98, a loop filter 100, a voltage controlled oscillator (VCO) 102, and a mixer 104. The FN-OPLL 92 also includes a second PLL 106. It should be noted that the second PLL 106 may also be used as the frequency synthesizer 26 (FIG. 1) for the mobile terminal 10 when in receive mode. In operation, the fractional-N divider 96 fractionally divides a local oscillator frequency signal ($F_{LO}$), which is the output of the second PLL 106 and a reference frequency ($F_{R1}$) for the first PLL 95, based on an integer value ($N_{INT1}$) and a fractional value (NUM1) to provide reference signal ($F_{R1}'$).

The values $N_{INT1}$ and NUM1 are generated by combiner circuitry 108 based on a modulation signal, which in this embodiment corresponds to the frequency signal (f) from the phase path of the modulator 36 of FIG. 2 and integer and fractional values $N_{INT0}$ and NUM0. The integer and fractional values $N_{INT0}$ and NUM0 define an initial fractional divide value ($N_0$), which corresponds to a desired center or carrier frequency of the output signal ($F_{VCO}$). The integer and fractional values $N_{INT0}$ and NUM0 may be provided by the control system 22 (FIG. 1).

In one embodiment, the combiner circuitry 108 combines the initial fractional divide value ($N_0$) and the modulation signal (f) using the following equation:

$N = N_0 + \text{Modulation}$, where $N = N_{INT1}.\text{NUM1}$, and

N is a combined divider value and "Modulation" is the modulation signal (f). The value $N_{INT1}$ is an integer portion of the combined divider value and NUM is a fractional part of the combined divider value.

The value $N_{INT1}$ is passed to delay circuitry 110 which delays the value $N_{INT1}$ with respect to the value NUM1. As discussed below, the delay ensures that the values $N_{INT1}$ and NUM1 are aligned at a summation node of the fractional-N divider 96.

An exemplary embodiment of the fractional-N divider 96 is also illustrated in FIG. 3, wherein the fractional-N divider 96 includes N-divider circuitry 112, a delta-sigma modulator 114, and summation circuitry 116. The summation circuitry 116 is generally referred to as combiner circuitry, and can comprise, for example, a digital binary adder. The operation of the fractional-N divider 96 is known in the art and is not described in detail herein. In general, the fractional-N divider 96 divides the local oscillator signal ($F_{LO}$) by $N_{INT1}$.NUM1, where $N_{INT1}$ is the integer portion of the combined divide value from the combiner circuitry 108 and NUM1 is the fractional portion of the combined divide value from the combiner circuitry 108. The delay circuitry 110 ensures that the values $N_{INT1}$ and NUM1 are aligned at the summation circuitry 116. Accordingly, an instantaneous divide value ($N_{INST}$) provided to the N-divider circuitry 112 from the summation circuitry 116 is defined as:

$$N_{INST} = N_{INT1}(\text{delayed}) + \text{sequence},$$

where $N_{INT1}$(delayed) is the output of the delay circuitry 110, and sequence is a current value of a sequence provided by the delta-sigma modulator 114, as will be apparent to one of ordinary skill in the art.

Since the fractional divide value ($N_{INT1}$.NUM1) of the fractional-N divider 96 is provided by the combiner circuitry 108 based on the modulation signal (f), the local oscillator signal ($F_{LO}$) is fractionally divided based on the modulation signal (f), thereby controlling the output signal ($F_{VCO}$) of the FN-OPLL 92 such that it is a phase or frequency modulated signal. Further, in one embodiment, the modulation signal (f) is a digital signal such that the FN-OPLL 92 provides a digital modulation interface. This is especially beneficial where the phase path of the modulator 36 from the data interface 52 to the FN-OPLL 92 is entirely a digital path according to one embodiment of the present invention.

The phase detector 98 compares the fractionally divided reference signal ($F_{R1}'$) output by the fractional-N divider 96 to an intermediate frequency signal ($F_{IF}$). The output of the phase detector 98 is filtered by the loop filter 100 and provided to the VCO 102 as a control voltage ($V_C$). The loop filter 100 is designed such that the first PLL 95 has a wide open-loop unity-gain bandwidth. In one embodiment, the first PLL 95 has a bandwidth of 800 kHz. Based on the control voltage ($V_C$), the VCO 102 provides the output signal ($F_{VCO}$). As described above with respect to the modulator 36 (FIG. 2), the output of the VCO 102 is the modulated signal and is provided to the power amplifier circuitry 38.

The output signal ($F_{VCO}$) of the VCO 102 is also provided to a feedback path including the mixer 104 and optionally a feedback filter 118. The mixer 104 operates to multiply the output signal ($F_{VCO}$) of the VCO 102 by a divided local oscillator signal ($F_{LO2}$). It should be noted that additional divider circuits may be placed between the VCO 102 and the mixer 104 depending on the particular implementation. The divided local oscillator signal ($F_{LO2}$) is provided by a divider 120, which operates to divide the local oscillator signal ($F_{LO}$) from the second PLL 106 by an integer divide value. The divider 120 may alternatively be a fractional-N divider. It should be noted that the divider 120 is optional, and the local oscillator signal ($F_{LO}$) may alternatively be provided to the mixer 104.

In operation, the mixer 104 multiplies the output signal ($F_{VCO}$) of the VCO 102 and the divided local oscillator signal ($F_{LO2}$), thereby down converting the output signal ($F_{VCO}$) to provide the intermediate frequency signal ($F_{IF}$). The output of the mixer 104 may include a high frequency component at a frequency equal to the frequency of the signal ($F_{VCO}$) plus the frequency of the divided local oscillator signal ($F_{LO2}$) and a low frequency component at a frequency equal to a difference of the frequency of the signal ($F_{VCO}$) and the frequency of the divided local oscillator signal ($F_{LO2}$), as commonly known. Thus, the output of the mixer 104 may optionally be filtered by the feedback filter 118 to remove either the high frequency component or the low frequency component depending on the particular implantation to thereby provide the intermediate frequency signal ($F_{IF}$) to the phase detector 98.

An exemplary embodiment of the second PLL 106 is also illustrated in FIG. 3. In this embodiment, the second PLL 106 is a fractional-N PLL and includes a phase detector 122, a loop filter 124, a voltage controlled oscillator (VCO2) 126, and a fractional-N divider 128. In operation, the voltage controlled oscillator 126 provides the local oscillator signal ($F_{LO}$). The local oscillator signal ($F_{LO}$) is fractionally divided by the fractional-N divider 128 to provide a feedback signal to one input of the phase detector 122. A reference frequency ($F_{R2}$), which may be generated by an oscillator, is provided to a second input of the phase detector 122. The phase detector 122 compares the feedback signal to the reference frequency ($F_{R2}$) and an output signal from the phase detector 122 is provided to the loop filter 124. The loop filter 124 filters the output signal from the phase detector 122 to provide a control voltage to the voltage controlled oscillator 126. In one embodiment, the loop filter 124 has a narrow bandwidth, such as 90 kHz. The frequency of the local oscillator signal ($F_{LO}$) is controlled by an external component, such as the control system 22 (FIG. 1), by controlling the control inputs ($N_{INT2}$ and NUM2) provided to the fractional-N divider 128. Accordingly, the control inputs $N_{INT2}$ and NUM2 may be controlled for channel selection and, as described below, for spur avoidance.

An additional benefit of the FN-OPLL 92 of the present invention is that it allows known spurs to be systematically avoided by controlling the reference frequency ($F_{R1}$), which is not possible in systems with fixed reference frequencies. In any PLL, spurs may occur at a frequency $F_{SPUR} = m*F1 + n*F2$, where F1 and F2 are fundamental signal frequencies, such as the frequency of the reference frequency ($F_{R2}$), the frequencies of the VCOs 102 and 126, or other external interfering sources. It should be noted that m and n are positive or negative integers. However, the FN-OPLL 92 enables the selection of the local oscillator frequency ($F_{LO}$), which is the reference frequency ($F_{R1}$) for the first PLL 95, to be selected such that the local oscillator signal ($F_{LO}$) is provided systematically to avoid known spurs, as described below.

As an example, assume that the reference frequency ($F_{R2}$) is 26 MHz and the desired frequency of the output signal ($F_{VCO}$) is 831.6 MHz. Spurs occur at harmonics of the reference frequency ($F_{R2}$), which are 26 MHz, 52 MHz, 78 MHz, . . . . According to the present invention, the second PLL 106 may be controlled via the inputs NUM2 and $N_{INT2}$ such that the frequency of the local oscillator frequency ($F_{LO}$) is sufficiently offset from the nearest harmonic of the reference frequency ($F_{R2}$). Thus, for example, the second PLL 106 may be controlled such that the local oscillator frequency ($F_{LO}$) is 873.18 MHz. The nearest spur is at the 34th harmonic of 26 MHz, which is 884 MHz. Accordingly, the offset between the spur and the local oscillator frequency ($F_{LO}$) is 10.82 MHz. Further, since the local oscillator frequency ($F_{LO}$), which is the reference frequency ($F_{R1}$) for the first PLL 95, is 873.18 MHz, and the desired frequency of the output signal ($F_{VCO}$) is 831.6 MHz, the spur at the first harmonic of the local oscillator frequency ($F_{LO}$) is nearest to the output signal ($F_{VCO}$). However, this spur is offset from the frequency of the output signal ($F_{VCO}$) by 41.58 MHz, which is the intermediate frequency ($F_{IF}$).

The amount of offset between the spur nearest to the local oscillator frequency ($F_{LO}$) and the local oscillator frequency ($F_{LO}$) needed to be "sufficient" depends on a bandwidth of the second PLL 106, which depends on the particular implementation, and integrated noise and settling time performance tradeoffs, as are well known in the art. In general, the spur offset should be greater than or equal to a minimum spur offset that places the nearest spur far enough outside the loop bandwidth to see appreciable attenuation from the rolloff of the loop response. In one embodiment, the minimum spur offset is three times the loop bandwidth. For example, if the bandwidth of the second PLL 106 is approximately 100 kHz, then the desired offset between the nearest spur and the local oscillator frequency ($F_{LO}$) may be 300 kHz. Similarly, the amount of offset between the spur nearest to the frequency of the output signal ($F_{VCO}$) and the frequency of the output signal ($F_{VCO}$) needed to be "sufficient" depends on a bandwidth of the first PLL 95, which depends on the particular implementation. For example, if the bandwidth of the first PLL 95 is approximately 1 MHz, then the desired offset between the nearest spur and the frequency of the output signal ($F_{VCO}$) may be 3 MHz.

The preferred spur management scheme of the present invention may be described as follows. Assuming high side injection at the mixer 104 ($F_{VCO} < F_{LO2}$), the operation of the FN-OPLL 92 may be described mathematically as:

$$F_{LO} = F_{R2} N2,$$

$$F_{LO2} = \frac{F_{R2} N2}{N3},$$

$$F_{IF} = F_{R1} = \frac{F_{LO}}{N1} = \frac{F_{R2} N2}{N1},$$

$$F_{VCO} = F_{LO2} - F_{IF} = \frac{F_{R2} N2}{N3} - \frac{F_{R2} N2}{N1} = F_{R2}\left(\frac{N2}{N3} - \frac{N2}{N1}\right),$$

where N1 is the fractional divide value of the fractional-N divider 96, N2 is the fractional divide value of the fractional-N divider 128, and N3 is the divide value of the divider 120.

In general, PLL spurs may occur at a frequency fsPuR given by:

$$f_{SPUR} = m \cdot f_1 + n \cdot f_2,$$

where $f_1$ and $f_2$ are fundamental signal frequencies and m and n are integers. Three specific spurs that can occur in the FN-OPLL 92 are spurs in the first PLL 95 from mixer products, fractional spurs in the first PLL 95, and fractional spurs in the second PLL 106. These spurs appear at the output of the first VCO 102, offset from the output frequency $F_{VCO}$. The spurs in the first PLL 95 from mixer products may be defined as:

$$f_{SPUR\_MIX} = m \cdot F_{VCO} + n \cdot F_{LO},$$

the fractional spurs in the first PLL 95 may be defined as:

$$f_{SPUR\_FN\_FVCO} = m \cdot F_{IF} + F_{VCO}, \text{ and}$$

the fractional spurs in the second PLL 106 may be defined as:

$$f_{SPUR\_FN\_FLO} = m \cdot F_{R2} + F_{LO}.$$

The spurs ($f_{SPUR\_MIX}$) are spurs that appear at the output of the mixer 104. The spurs ($f_{SPUR\_FN\_FVCO}$) are spurs that appear at the output of the first PLL 95 that are a product of the fundamental frequency of the first VCO 102 and harmonics of the intermediate frequency $F_{IF}$. The spurs ($f_{SPUR\_FN\_FLO}$) are spur products that appear in the second PLL 106 that are a product of the fundamental frequency of the second VCO 126 and harmonics of the reference frequency $F_{R2}$.

According to the present invention, these spurs can be prevented by the design of an appropriate frequency plan. The mixer product spurs ($f_{SPUR\_Mix}$), the fractional spurs in the first PLL 95 ($f_{SPUR\_FN\_FVCO}$), and the fractional spurs in the second PLL 106 ($f_{SPUR\_FN\_FLO}$) can be avoided by adjusting the intermediate frequency $F_{IF}$ for each radio frequency transmit channel according to the following spur management scheme.

For the mixer product spurs ($f_{SPUR\_MIX}$), the output frequency products $f_{OUT}$ of the mixer 104 can be expressed as the linear combinations of the input frequencies, $F_{VCO}$ and $F_{LO}$:

$$f_{OUT} = |m \cdot F_{VCO} + n \cdot F_{LO}|, \tag{1}$$

where, m, n ∈ Integer and the order of the output frequency product is defined as:

$$\text{order} = |m| + |n| \tag{2}$$

The desired intermediate frequency FIF of the mixer 104 is defined to be:

$$F_{IF} \equiv |F_{VCO} - F_{LO}|. \tag{3}$$

In general, for some values of m and n, it is possible to have $$f_{OUT} < F_{IF}$$

It is desirable to filter the unwanted mixer output frequency products with a simple lowpass type filter, such as the feedback filter 118, but this requires $$f_{OUT} \geq F_{IF} \tag{4}$$

for all values of m and n.

The relation expressed in (4) will hold if $F_{VCO}$ is a positive integer multiple of $F_{IF}$:

$$F_{IF} = \frac{F_{VCO}}{p_o} \tag{5}$$

where $p_o \in \text{Integer}^+ (1,2,3 \dots)$.

Substituting (5) into (3), $F_{LO}$ can be expressed as:

$$F_{LO} = F_{VCO}\left(\frac{p_o + 1}{p_o}\right) \quad F_{VCO} < F_{LO} \quad (6)$$

$$F_{LO} = F_{VCO}\left(\frac{p_o - 1}{p_o}\right) \quad F_{LO} < F_{VCO}.$$

With the constraint of (5), the mixer output product frequencies $f_{OUT}$ can be expressed as, $$f_{out_{mn}} = \left|\frac{F_{VCO}}{p_o}(m \cdot p_o + n \cdot (p_o \pm 1))\right|. \quad (7)$$

It follows from (7) that all the mixer output products $f_{OUT}$ will appear at integer multiples of the IF frequency, $F_{VCO}|p_o$, allowing the undesired mixer output products (higher order multiples of $F_{IF}$) to be low-pass filtered with the feedback filter 118.

Accordingly, the baseband processor 20 (FIG. 1) may provide the values $N_{INT2}$ and NUM2 to the fractional-N divider 128 according to equation (5) for each radio frequency transmit channel. Then, by low-pass filtering the output of the mixer 104 with the feedback filter 118 having a cutoff frequency, $f_{BW}$, in the range of $$F_{IF} < f_{BW} < 2F_{IF},$$

the spur management scheme of the present invention essentially prevents significant mixer product spurs ($F_{SPUR\_MIX}$) from appearing in the first PLL 95. In other words, the spur management scheme ensures that the mixer product spurs ($f_{SPUR\_MIX}$) are sufficiently attenuated to meet radio requirements.

By controlling the second PLL 106 such that the output frequency $F_{VCO}$ is an integer multiple of the intermediate frequency $F_{IF}$, the fractional spurs ($f_{SPUR}\_FN_{FVCO}$) in the first PLL 95 are also prevented. More specifically, by controlling the intermediate frequency $F_{IF}$ such that the output frequency $F_{VCO}$ is an integer multiple of the intermediate frequency $F_{IF}$, the fractional spurs ($f_{SPUR\_FN\_FVCO}$) that appear closest to the output frequency $F_{VCO}$ occur at $F_{VCO}+F_{IF}$ and $F_{VCO}-F_{IF}$. Accordingly, the fractional spurs ($f_{SPUR\_FN\_FVCO}$) are easily filtered from the output of the first PLL 95 by the rolloff of the loop response.

In general, the RF to IF ratio ($p_o$) could be fixed for a given design. However, if $p_o$ is allowed to vary, the fractional spurs ($f_{SPUR\_FN\_FLO}$) in the second PLL 106 can also be avoided. From equation (6), the LO frequency $F_{LO}$ is a function of ($p_o$) and can be varied by varying ($p_o$) while maintaining the desired RF to IF relationship expressed in equation (5). Accordingly, the RF to IF ratio ($p_o$) may be varied such that the fractional spurs ($f_{SPUR\_FN\_FLO}$) in the second PLL 106 are sufficiently offset from the LO frequency $F_{LO}$. As discussed above, a "sufficient" offset depends on the particular implementation. As an example, the RF to IF ratio ($p_o$) may be varied such that the fractional spurs ($f_{SPUR\_FN\_FLO}$) in the second PLL 106 are offset from the local oscillator frequency $F_{LO}$ by at least 5 MHz. As a result, the fractional spurs ($f_{SPUR\_FN\_FLO}$) may easily be filtered by the loop filter 124 of the second PLL 106.

As an example, assume that the desired output frequency $F_{VCO}$ is 893.20 MHz, the reference frequency $F_{R2}$ is 25 MHz, and $p_o$ is 11. Equation (5) provides that the intermediate frequency $F_{IF}$ is then 81.20 MHz, and equation (6) provides that the local oscillator frequency $F_{LO}$ is 974.4 MHz for high-side injection ($F_{VCO} < F_{LO}$).

Accordingly, the mixer product spurs ($f_{SPUR\_MIX}$) appear at 81.20 MHz, 162.4 MHz (2*81.20 MHz), 243.6 MHz (3*81.20 MHz), etc. Thus, according to the spur management scheme of the present invention, the feedback filter 118 with $f_{bw} < 162.4$ MHz may be used to remove, or attenuate, all of the mixer product spurs ($f_{SPUR\_MIX}$) above the fundamental frequency of 81.20 MHz.

The fractional spurs ($f_{SPUR\_FN\_FVCO}$) in the first PLL 95 appear at 812.0 MHz (893.20−81.20 MHz), 974.4 MHz (893.20+81.20 MHz), 730.8 MHz (893.20−2*81.20 MHz), 1055.6 MHz (893.20+2*81.20 MHz), . . . , 893.20+m*81.20 MHz. Thus, the closest spurs to the fundamental output frequency $F_{VCO}$ (893.20 MHz) are offset by 81.20 MHz. As such, the loop filter 100 of the first PLL 95 filters, or sufficiently attenuates, the fractional spurs ($f_{SPUR\_FN\_FVCO}$) in the first PLL 95.

The fractional spurs ($f_{SPUR\_FN\_FLO}$) in the second PLL 106 appear at 949.4 MHz (974.4−25.0 MHz), 999.4 MHz (974.4+25.0 MHz), 924.4 MHz (974.4−2*25.0 MHz), 1024.4 MHz (974.4+2*25.0 MHz), . . . , 974.4+m*25.0 MHz. The closest fractional spur ($f_{SPUR\_FN\_FLO}$) to the local oscillator frequency $F_{LO}$ (974.4 MHz) output by the second PLL 106 is at an offset of only 0.600 MHz (974.4−39*25 MHz). Accordingly, in some implementations, this spur may be too close to be adequately attenuated by the loop filter 124 of the second PLL 106.

However, if the RF to IF ratio ($p_o$) is selected to be 12 instead of 11, the fractional spurs ($f_{SPUR\_FN\_FLO}$) in the second PLL 106 may be rejected simultaneously with the mixer product spurs ($f_{SPUR\_MIX}$) and the fractional spurs ($f_{SPUR\_FN\_FVCO}$) in the first PLL 95. More specifically, if the desired output frequency $F_{VCO}$ is 893.20 MHz, the reference frequency $F_{R2}$ is 25 MHz, and $p_o$ is 12, equation (5) provides that the intermediate frequency $F_{IF}$ is 74.43 MHz, and equation (6) provides that the local oscillator frequency $F_{LO}$ is 967.63 MHz for high-side injection ($F_{VCO} < F_{LO}$).

Now the mixer product spurs ($f_{SPUR\_MIX}$) are constrained to appear at offset frequencies equal to harmonics of the intermediate frequency ($F_{IF}$). In this example, the spurs are at 74.43 MHz, 148.86 MHz (2*74.43 MHz), 223.29 MHz (3*74.43 MHz), etc. Thus, according to the spur management scheme of the present invention, the feedback filter 118 with $f_{bw} < 148.86$ MHz may be used to remove, or attenuate, all of the mixer product spurs ($f_{SPUR\_MIX}$) above the fundamental frequency of 74.43 MHz, which is the intermediate frequency ($F_{IF}$).

Similarly, the fractional spurs ($f_{SPUR\_FN\_FVCO}$) in the first PLL 95 are constrained to appear at offset frequencies equal to harmonics of the intermediate frequency ($F_{IF}$). In this example, the spurs are at 818.77 MHz (893.20−74.43 MHz), 967.63 MHz (893.2+74.43 MHz), 744.34 MHz (893.20−2*74.43 MHz), 1042.06 MHz (893.20+2*74.43 MHz), . . . , 893.20+m*74.43 MHz. Thus, the closest spurs to the fundamental output frequency $F_{VCO}$ (893.20 MHz) are offset by 74.43 MHz, which is the intermediate frequency ($F_{IF}$). As such, the loop filter 100 of the first PLL 95 filters, or sufficiently attenuates, the fractional spurs ($f_{SPUR\_FN\_FVCO}$) in the first PLL 95.

The fractional spurs ($f_{SPUR\_FN\_FLO}$) in the second PLL 106 appear at 942.63 MHz (967.63−25.0 MHz), 992.63 MHz (967.63+25.0 MHz), 917.63 MHz (967.63−2*25.0 MHz), 1017.63 MHz (967.63+2*25.0 MHz), . . . , 967.63+m*25.0 MHz. Thus, the closest fractional spur ($f_{SPUR\_FN\_FLO}$) to the local oscillator frequency $F_{LO}$ (974.4

MHz) output by the second PLL 106 is at an offset of 7.37 MHz (967.63−39*25 MHz), rather than the 0.600 MHz offset when $p_o$ was 11. Accordingly, the loop filter 124 of the second PLL 106 rejects, or provides sufficient attenuation, of the fractional spurs in the second PLL 106 ($f_{SPUR\_FN\_FLO}$).

In this manner, the RF to IF ratio ($p_o$) may be selected for each desired output frequency $F_{VCO}$ such that the mixer product spurs ($f_{SPUR\_MIX}$), the fractional spurs ($f_{SPUR\_FN\_FVCO}$) in the first PLL 95, and the fractional spurs ($f_{SPUR\_FN\_FLO}$) in the second PLL 106 may be simultaneously rejected. Once the RF to IF ratio ($p_o$) is selected, the desired local oscillator frequency FLO and the desired intermediate frequency $F_{IF}$ may be determined using equations (5) and (6). Then, the values $N_{INT2}$ and NUM2 corresponding to the desired local oscillator frequency $F_{LO}$ are provided to the second PLL 106, and the values $N_{INT0}$ and NUM0 corresponding to the output frequency $F_{VCO}$ are determined based on the equations above and provided to the combiner circuitry 108.

The present invention provides substantial opportunity for variation without departing from the spirit or scope of the present invention. For example, the FN-OPLL 92 is described above as part of a modulator 36. However, the FN-OPLL 92 is not limited thereto, and may be used in any system or implementation where it is desirable to provide a controllable output frequency signal. Also, additional multipliers or dividers may be placed in any of the braches of the FN-OPLL 92 of FIG. 3. As an example, a multiplier or divider may be placed between the first VCO 102 and the output of the first PLL 95 and the mixer 104. As another example, additional multipliers or dividers may be placed between the output of the second VCO 126 and the fractional-N divider circuitry 128.

It will be recognized that the present invention provides a wide bandwidth PLL having a digital modulation interface and a corresponding method capable of avoiding known spurs. Of the three known types of spurs discussed above, the mixer product spurs ($f_{SPUR\_MIX}$) and the fractional spurs ($f_{SPUR\_FN\_FVCO}$) are constrained to appear in the output of the first PLL 95 only at offsets equal to harmonics of the intermediate frequency ($F_{IF}$). These spurs and the fractional spurs ($f_{SPUR\_FN\_FLO}$) can be sufficiently attenuated by the loop filters 100 and 124 and the feedback filter 118 to meet system performance requirements.

Those skilled in the art will recognize improvements and modifications to the preferred embodiments of the present invention. All such improvements and modifications are considered within the scope of the concepts disclosed herein and the claims that follow.

What is claimed is:

1. A phase locked loop system comprising:
   loop circuitry adapted to provide an output signal based on a divided reference signal;
   combiner circuitry adapted to combine an initial fractional divide value and a modulation signal to provide a combined fractional divide value; and
   a fractional-N divider adapted to fractionally divide a reference signal based on the combined fractional divide value to provide the divided reference signal such that the output signal is phase modulated.

2. The system of claim 1 wherein the loop circuitry adapted to provide the output signal comprises:
   a phase detector adapted to compare a phase of the divided reference signal to a phase of a feedback signal;
   a loop filter adapted to filter an output of the phase detector to provide a control signal; controlled oscillator circuitry adapted to provide the output signal based on the control signal; and
   feedback circuitry adapted to provide the feedback signal based on the output signal.

3. The system of claim 2 wherein the feedback circuitry comprises mixer circuitry adapted to multiply the output signal and a local oscillator signal to provide the feedback signal.

4. The system of claim 3 wherein the feedback circuitry further comprises filtering circuitry adapted to filter the feedback signal prior to providing the feedback signal to the phase detector.

5. The system of claim 4 further comprising a second phase locked loop adapted to provide the local oscillator signal based on a second reference signal.

6. The system of claim 5 wherein the local oscillator signal is also provided to the fractional-N divider as the reference signal.

7. The system of claim 5 wherein the second phase locked loop is a fractional-N phase locked loop and provides the local oscillator signal based on the second reference signal and a second fractional divide value.

8. The system of claim 7 wherein the initial fractional divide value and the second fractional divide value are provided in concert such that the output signal is provided at a desired output frequency and spurs in the loop circuitry are avoided.

9. The system of claim 7 wherein the second fractional divide value is provided such that a desired output frequency of the output signal is an integer multiple of an intermediate frequency of the feedback signal and mixer output products output from the mixer circuitry appear at integer multiples of the intermediate frequency.

10. The system of claim 9 wherein the filtering circuitry comprises a low-pass filter adapted to filter the mixer output products output from the mixer circuitry to provide the feedback signal at the intermediate frequency.

11. The system of claim 9 wherein providing the second fractional divide value such that the desired output frequency of the output signal is the integer multiple of the intermediate frequency of the feedback signal ensures that fractional spurs appearing in the output signal are offset from the desired output frequency by at least an offset equal to the intermediate frequency.

12. The system of claim 11 wherein a loop response of the loop circuitry is such that the fractional spurs at frequencies other than the desired output frequency are filtered from the output signal.

13. The system of claim 11 wherein the integer multiple is selected such that there is at least a minimum offset between fractional spurs appearing in the local oscillator signal and a frequency of the local oscillator signal.

14. The system of claim 13 wherein the second phase locked loop comprises a second loop filter adapted to filter the fractional spurs from the local oscillator signal.

15. The system of claim 13 wherein the minimum offset is defined based on a bandwidth of the second phase locked loop.

16. The system of claim 1 wherein the combiner circuitry has a digital interface and the modulation signal is a digital signal.

17. The system of claim 16 wherein the phase locked loop system is part of modulation circuitry in a transmitter of a mobile terminal and the modulation circuitry provides an all digital path from processing circuitry of the mobile terminal to the digital interface of the combiner circuitry.

18. The system of claim 1 further comprising a digital pre-distortion filter adapted to pre-distort the modulation signal to provide a pre distorted modulation signal to the combiner circuitry.

19. A method of providing a modulated signal using a phase locked loop system comprising:
providing an output signal based on a divided reference signal;
combining an initial fractional divide value and a modulation signal to provide a combined fractional divide value; and
fractionally dividing a reference signal based on the combined fractional divide value to provide the divided reference signal such that the output signal is phase modulated.

20. The method of claim 19 wherein providing the output signal comprises: comparing a phase of the divided reference signal to a phase of a feedback signal to provide a comparison signal;
filtering the comparison signal to provide a control signal;
providing the control signal to a voltage controlled oscillator to control a frequency of the output signal; and
providing the feedback signal based on the output signal.

21. The method of claim 20 wherein providing the feedback signal comprises multiplying the output signal and a local oscillator signal to provide the feedback signal.

22. The method of claim 21 wherein providing the feedback signal further comprises filtering the feedback signal prior to providing the feedback signal to the phase detector.

23. The method of claim 21 further comprising providing the local oscillator signal based on a second reference signal.

24. The method of claim 23 further comprising providing the local oscillator signal to the ional-N divider as the reference signal.

25. The method of claim 23 wherein providing the local oscillator signal comprises providing a fractional-N phase locked loop operating based on the second reference signal and a second fractional divide value.

26. The method of claim 25 further comprising providing the initial fractional divide value, and wherein providing the initial fractional divide value and providing the second fractional divide value comprise providing the initial fractional divide value and the second fractional divide value in concert such that the output signal is provided at a desired output frequency and spurs in the phase locked loop system are avoided.

27. The method of claim 19 further comprising pre-distorting the modulation signal such that the initial fractional divide value is combined with a pre-distorted version of the modulation signal to provide the combined fractional divide value.

* * * * *